United States Patent [19]
Saito

[11] Patent Number: 5,265,102
[45] Date of Patent: Nov. 23, 1993

[54] TEST PATTERN GENERATOR
[75] Inventor: Atsushi Saito, Ota, Japan
[73] Assignee: Advantest Corporation, Tokyo, Japan
[21] Appl. No.: 655,364
[22] PCT Filed: Jun. 13, 1990
[86] PCT No.: PCT/JP90/00767
  § 371 Date: Feb. 14, 1991
  § 102(e) Date: Feb. 14, 1991
[87] PCT Pub. No.: WO90/15999
  PCT Pub. Date: Dec. 27, 1990

[30] Foreign Application Priority Data
  Jun. 16, 1989 [JP] Japan .................. 1-154097
[51] Int. Cl.⁵ .................................... G06F 11/00
[52] U.S. Cl. ...................................... 371/27
[58] Field of Search ............ 371/27, 22.1, 37.3, 371/40.1, 21.1, 10.1, 61, 62, 21.5, 2.1, 15, 13; 365/200, 201

[56]   References Cited
U.S. PATENT DOCUMENTS

| | | | |
|---|---|---|---|
| 3,982,111 | 9/1976 | Lerner et al. | 371/21.1 |
| 4,622,668 | 11/1986 | Dancker et al. | 371/21.1 |
| 4,782,487 | 11/1988 | Smelser | 371/27 |
| 4,827,476 | 5/1989 | Garcia | 371/21.1 |
| 4,980,888 | 12/1990 | Bruce et al. | 371/21.1 |
| 5,091,910 | 2/1992 | Ochi | 371/21.1 |
| 5,127,010 | 6/1992 | Satoh | 371/21.1 |

FOREIGN PATENT DOCUMENTS

| | | |
|---|---|---|
| 48-96258 | 12/1973 | Japan . |
| 59-204782 | 11/1984 | Japan . |
| 59-207495 | 11/1984 | Japan . |
| 63-183696 | 7/1988 | Japan . |
| 63-265181 | 11/1988 | Japan . |

Primary Examiner—Robert W. Beausoliel, Jr.
Assistant Examiner—Phung M. Chung
Attorney, Agent, or Firm—Staas & Halsey

[57] ABSTRACT

The present invention is directed to a test pattern generator which generates test patterns for testing semiconductor integrated circuits. A DRAM is employed as a test pattern memory. A control circuit generates an address generating clock, a readout control signal, a refresh control signal and a write clock. An address generating circuit responds to the address generating clock to generate an address for reading out of the DRAM of the test pattern generator. Based on the address and the readout control signal, test patterns are read out from the DRAM of the test pattern generator and then they are written into a FiFo memory by the write clock. On the other hand, test patterns are continuously read out from the FiFo memory in synchronization with a pattern generating clock. The average readout rate from the DRAM, including the refresh period, is selected to be higher than the readout rate from the FiFo memory. When filled with the test patterns, the FiFo memory outputs a full flag signal and the control circuit responds to the full flag signal to stop the generation of the address generating clock, the readout control signal and the write clock and, when the full flag signal is reset, resumes their generation. Hence, even if the DRAM is refreshed at regular time intervals, test patterns can be continuously read out from the FiFo memory.

6 Claims, 6 Drawing Sheets

TEST PATTERN GENERATOR

TECHNICAL FIELD

The present invention relates to a test pattern generator which generates test patterns for testing semiconductor integrated circuits.

BACKGROUND ART

A test pattern generator forms a part of an IC tester for testing semiconductor ICs and generates a test pattern to be applied to the IC under test and an expected value pattern for comparison with a response from the IC under test. These two patterns are commonly referred to simply as a test pattern.

A conventional test pattern generator is shown in FIG. 1. A clock PCK for pattern generating use and a start signal S are applied to an address generating circuit 11 and an address provided therefrom is used to read out a test pattern memory 12 in which a test pattern has been stored. The test pattern memory 12 is usually constituted by an SRAM (i.e. a static RAM).

A large-capacity test pattern memory is needed to cope with extended test patterns which result from an increased degree of integration of circuits to be tested and an automatic generation of test patterns by a computer. Conventionally, such a large-capacity test pattern memory employs the SRAM, and hence is expensive.

The number of transistors necessary for forming one memory cell is four to six in the case of the SRAM but only one in the case of a DRAM (i.e. a dynamic RAM). In the case of fabricating IC memories of the same chip area through a patterning process under the same rule, the IC memory using the DRAM is larger in capacity and lower in the unit cost per bit than the IC memory using the SRAM. Hence, the use of the DRAM will cut the manufacturing cost of the test pattern memory. However, stored contents of the DRAM will disappear unless refreshed at regular time intervals, and during the refresh the readout of a test pattern is suspended, making high-speed pattern generation impossible. On this account, the prior art does not employ the DRAM for the test pattern memory.

The present invention is to provide a test pattern generator which can be fabricated at low cost through use of the DRAM and is capable of generating test patterns at high speed.

DISCLOSURE OF THE INVENTION

According to the present invention, a control circuit, which operates on a system clock, is controlled by a start signal and a full flag to generate an address generating clock, a readout control signal and a write clock and, at the same time, a refresh control circuit is periodically provided from the control circuit. An address generating circuit is controlled by the address generating clock from the control circuit to generate an address. A test pattern memory formed by the DRAM and having stored therein test patterns is read out, based on the address from the address generating circuit and the readout control signal from the control circuit, and at the same time, the test pattern memory performs a refreshing operation based on the refresh control signal provided from the control circuit. The test pattern read out from the test pattern memory is written into a FiFo memory by the write clock from the control circuit. When filled with test patterns, the FiFo memory provides a full flag to the control circuit and the test patterns are read out from the FiFo memory in synchronism with the pattern generating clock. The address generating clock is made higher in rate than the pattern generating clock.

When the FiFo memory becomes full, the readout of the test pattern is started, and when the full flag falls, the address generating clock, the readout control signal and the write clock are produced and then the test pattern memory is read out. The test pattern thus read out is written into the FiFo memory and the refresh control signal is produced. Even while the test pattern memory performs the refreshing operation based on the refresh control signal, the readout of the test pattern from the FiFo memory is continued. Upon completion of the refreshing operation, the readout of the test pattern memory is resumed and the test pattern read out therefrom is written into the FiFo memory. Consequently, test patterns can be read out of the FiFo memory continuously and hence at high speed without being affected by the refreshing operation of the test pattern memory.

BEST MODE FOR CARRYING OUT THE INVENTION

Figure 1:
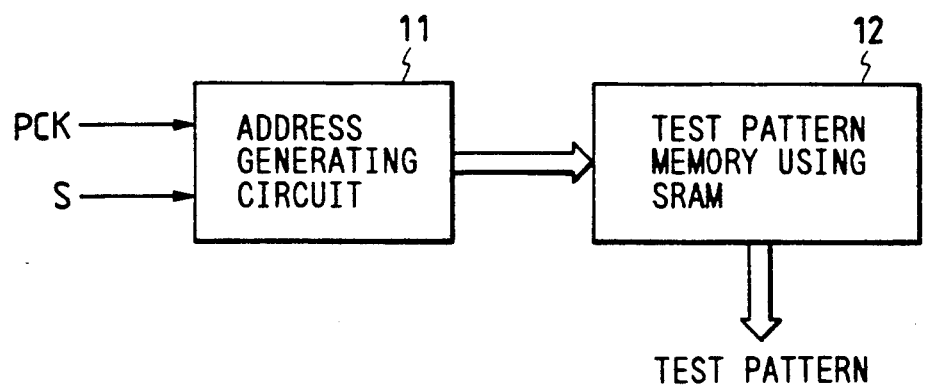
FIG. 1 is a block diagram showing a conventional test pattern generator.
Figure 2:
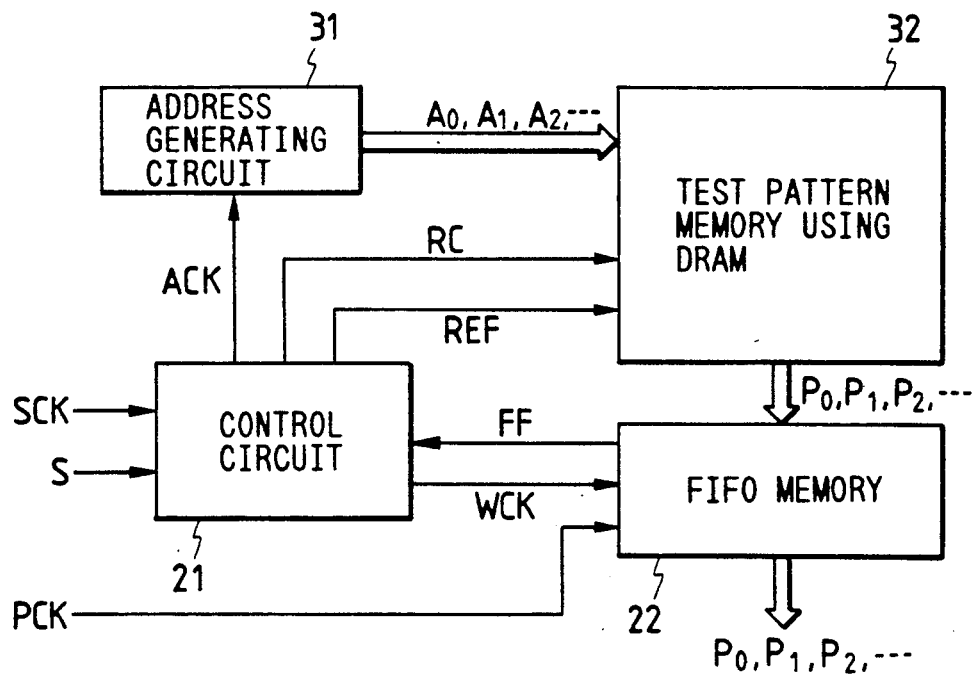
FIG. 2 is a block diagram illustrating an embodiment of the present invention.

FIG. 2 illustrates an embodiment of the test pattern generator according to the present invention. The test pattern generator of the present invention comprises a control circuit 21, a FiFo memory 22, an address generating circuit 31 and a DRAM 32 serving as a test pattern memory, and is supplied with a system clock SCK, a pattern generating clock PCK and a start signal S from a control section of an IC tester (not shown) to perform a test pattern generating operation. The control circuit 21 is synchronized with the system clock to generate a refresh control signal REF, an address generating clock ACK, a readout control signal RC and a write clock WCK with predetermined periods, respectively, but during its generation of the refresh control signal REF and during the input thereinto of a full flag FF from the FiFo memory 22, the control circuit does not generate the address generating clock, the readout control signal and the write clock.

Figure 3:
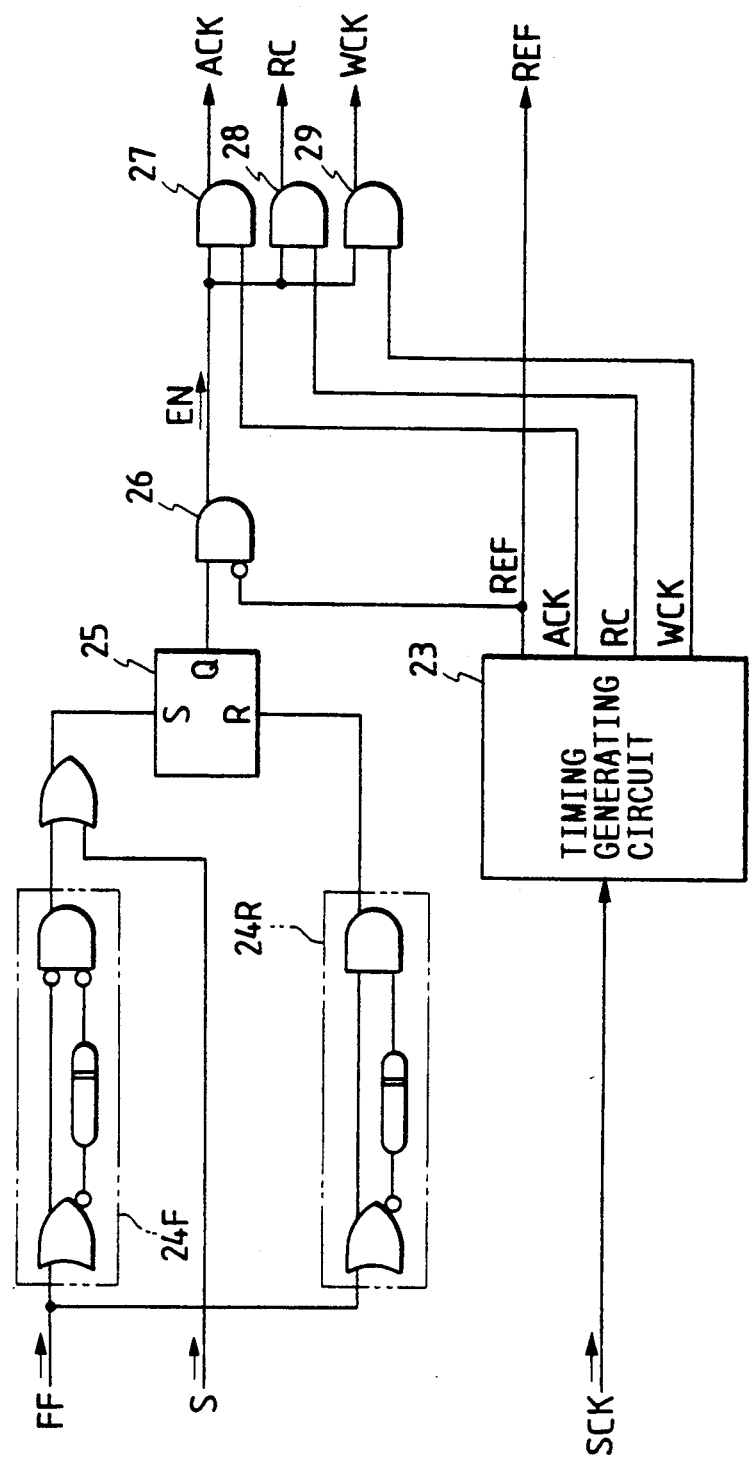
FIG. 3 is a circuit diagram showing a specific operative example of a control circuit 21.

The control circuit 21 is made up of a timing generating circuit 23, a full flag rise detector circuit 24R, a full flag fall detector circuit 24F, a flip-flop 25 and AND gates 26 to 29, as depicted in FIG. 3. The timing generator 23 generates the address generating clock ACK, the readout control signal RC, the write clock WCK and the refresh control signal REF on predetermined periods, respectively, and in synchronism with the system clock SCK and applies the first three signals to the AND gates 27 to 29 at one input thereof and provides the refresh control signal REF, as an inhibit signal, to the AND gate 26 and, at the same time, applies it to the test pattern memory 32. The flip-flop 25 is set by the start signal S and its Q output goes high and is provided, as an enable signal EN, via the AND gate 26 to the other inputs of the AND gates 27 to 29 to enable these gates, through which the address generating clock ACK, the readout control signal RC and the write clock WCK are output. When the full flag FF is applied from the FiFo memory 22, its leading edge is detected by the full flag rise detector 24R and its detected output is used to reset the flip-flop 25; so that the enable signal EN goes low and the gates 27 to 29 are disabled, stopping the outputting of the address generating clock ACK, the readout control signal RC and the write clock WCK. When the full flag FF falls, its trailing edge is detected by the fall detector 24F and, by its detected output, the flip-flop 25 is set; so that the enable signal EN goes high again and the afore-mentioned two signals are output again. When the refresh control signal REF is yielded during the high-level period of the Q output of the flip-flop 25, the gate 26 is disabled; so that during the high-level period of the signal REF the enable signal EN is held low, disabling the gates 27 through 29.

Referring back to FIG. 2, the address generating clock ACK from the control circuit 21 is applied to the address generator 31, which, in turn, generates addresses $A_0, A_1, A_2, \ldots$ one by one upon each application of the address generating clock ACK. The addresses thus obtained and the readout control signal RC from the control circuit 21 are used to read out test patterns $P_0, P_1, P_2, \ldots$ from the test pattern memory 32. The test pattern memory 32 is formed by a DRAM, which has stored therein test patterns and performs the refresh operation when supplied with the refresh control signal REF from the control circuit 21.

The test patterns $P_0, P_1, P_2, \ldots$ read out of the test pattern memory 32 are written into the FiFo memory 22 by the write clock WCK provided from the control circuit. When filled with the test patterns, the FiFo memory 22 provides the full flag FF to the control circuit 21. Ordinary FiFo memories have a full flag generating function. The FiFo memory 22 is read out in synchronism with the pattern generating clock PCK. The readout of the FiFo memory 22 starts with old data. The rate of the pattern generating clock PCK is made higher than the rate of the address generating clock ACK. More specifically, letting the period of the pattern generating clock PCK, the readout period of the test pattern memory 32 (i.e. the period of the address generating clock ACK) and the time for refreshing the test pattern memory 32 be represented by $T_1$, $T_2$ and $T_r$, respectively, and assuming that the test pattern memory 32 is refreshed every m-th readout therefrom, the period $T_2$ is chosen so that the following relationship holds:

$$m \times T_1 > m \times T_2 + T_r \ldots \quad (1)$$

Figure 4:
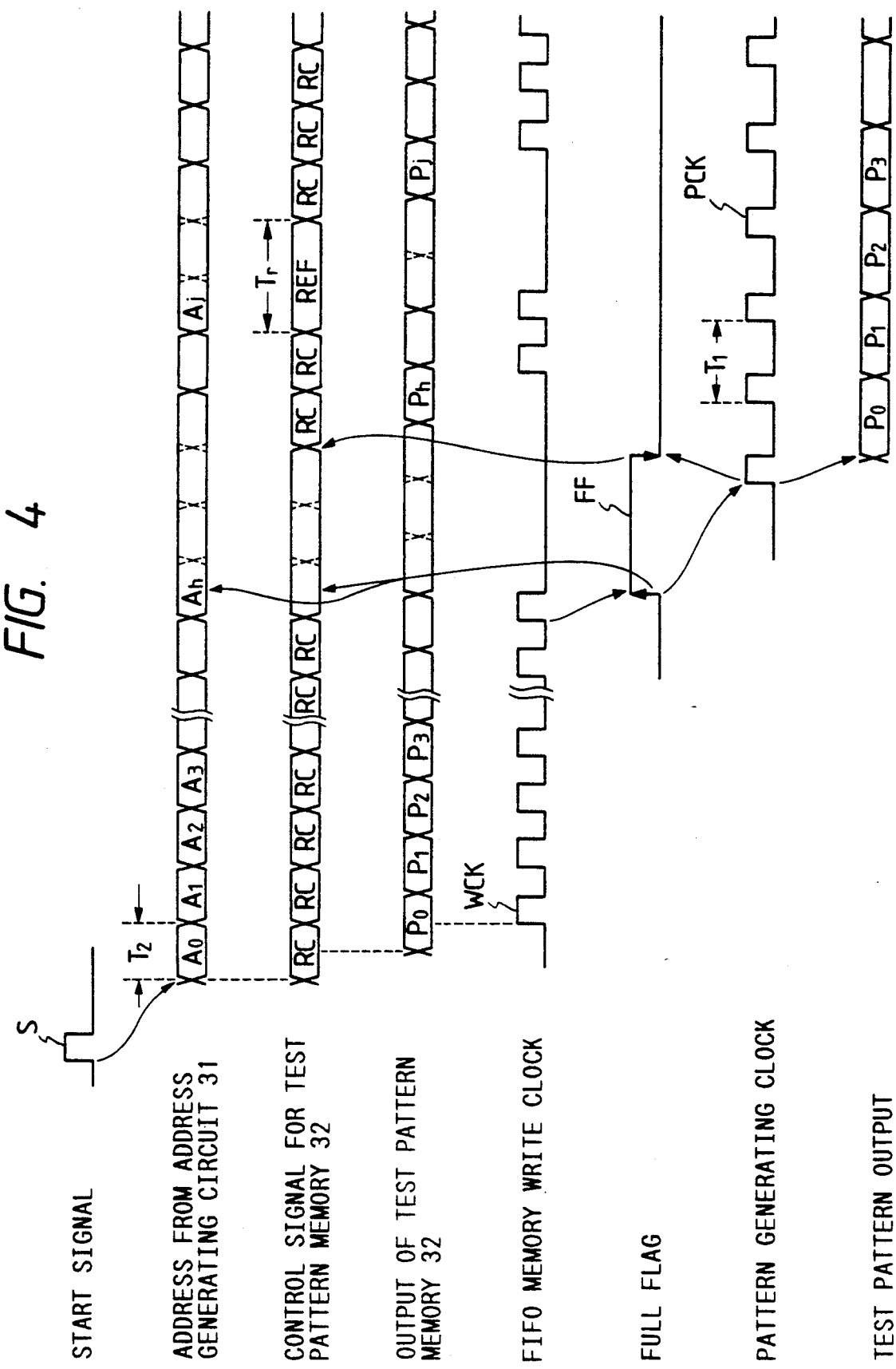
FIG. 4 is a timing chart showing an example of operation of the present invention.

When the start signal S is applied to the control circuit 21 as shown in FIG. 4, the flip-flop 25 is set to make the enable signal EN high, by which the gates 27 to 29 are enabled, starting the output of the address generating clock ACK. By this, the addresses $A_0, A_1, A_2, \ldots$ are produced one after another by the address generator 31, and at the same time, the control circuit 21 starts to generate the readout control signal RC, and the test patterns $P_0, P_1, P_2,$ are sequentially read out of the test pattern memory 32 and then written into the FiFo memory 22 by the write clock WCK. When the FiFo memory 22 becomes full, the full flag FF rises, by which the flip-flop 25 is reset and the enable signal EN goes low. Consequently, the gates 27, 28 and 29 inhibit the passage therethrough of the address generating clock ACK, the readout control signal RC and the write clock WCK, respectively, and the readout of the test pattern memory 32 is stopped. At the same time, the write into the FiFo memory 22 is also stopped. Hence, the readout of the test pattern memory 32 by an address $A_h$ being generated by the address generator 31 at that time is not performed and the address $A_h$ is retained. On the other hand, the pattern generating clock PCK is input in this state and the FiFo memory 22 is read out in synchronism with the clock PCK, providing the test patterns $P_0, P_1, P_2, \ldots$. Upon initiation of the readout of the FiFo memory 22, the full flag FF falls, by which the flip-flop 25 is set. As a result of this, the enable signal EN goes high again and the readout of the test pattern memory 32 by the retained address $A_h$ is resumed and the write into the FiFo memory 22 is also resumed.

When supplied with the refresh control signal REF from the control circuit 21, the test pattern memory 32 performs the refresh operation. Since the gate 26 is kept disabled during the refresh of the test pattern memory 32, the enable signal EN goes low and the gates 27, 28 and 29 inhibit the passage therethrough of the address generating clock ACK, the readout control signal RC and the write clock WCK, respectively. The address generator 31 retains an address $A_j$ that it is generating at that time, and the write into the FiFo memory 22 is also stopped, but the readout of the FiFo memory 22 by the pattern generating clock PCK is continued; so that output test patterns are continuously obtained. Upon completion of the refresh operation of the test pattern memory 32, the gate 26 is enabled and the readout of the test pattern memory 32 is resumed by the address $A_j$ and the write into the FiFo memory 22 is also resumed.

Since the average readout rate of the test pattern memory 32, including the refresh period, is higher than the readout rate of the FiFo memory 22, the memory 22 becomes full until the refresh control signal REF is generated next. Thus, the test patterns can be continuously read out from the FiFo memory 22.

Figure 5:
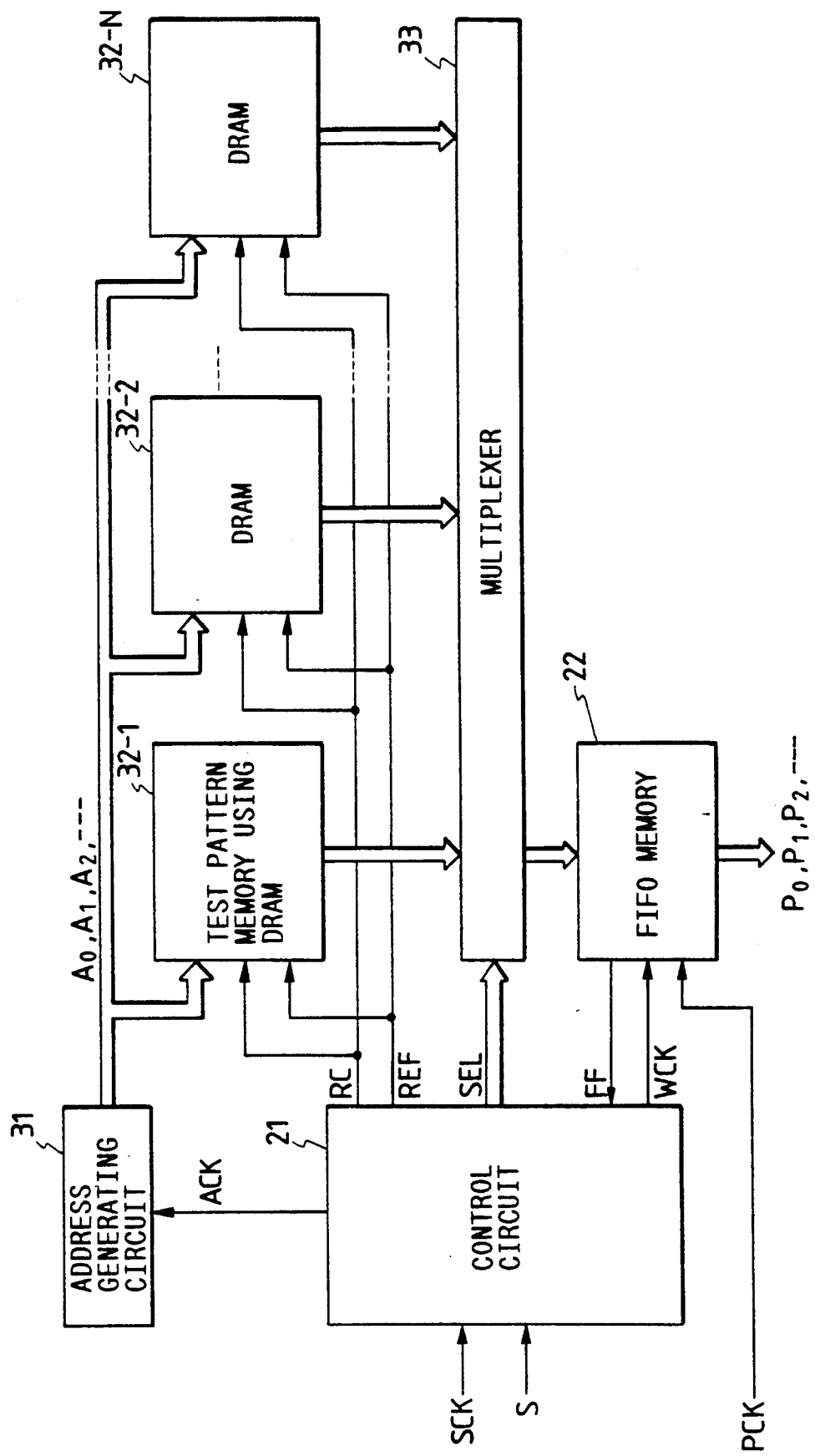
FIG. 5 is a block diagram illustrating a modified form of the present invention.

In the case where the readout rate ($1/T_2$) of the test pattern memory 32 cannot be made higher than a desired readout rate ($1/T_1$) of the FiFo memory 22 so that the condition of Eq. (1) is fulfilled, it is possible to employ such an arrangement as shown in FIG. 5, in which N (where N is an integer equal to or greater than 2) test pattern memories 32-1 to 32-N are provided for one FiFo memory 22 and are simultaneously operated by the addresses $A_0, A_1, \ldots$, the readout control signal RC and the refresh control signal REF common to them and test patterns thus read out of the N test pattern memories are taken out by a multiplexer 33 sequentially and cyclically and written into the FiFo memory 22. In this instance, the control circuit 21 needs only to have an arrangement in which the system clock SCK of the period $T_2$ is repeatedly counted from 0 to $N-1$ by an N-ary counter in the timing generator 23 in FIG. 3 and the count values are sequentially output as a select signal SEL and a signal of a period $N_x T_2$ and a desired phase, obtained by detecting a desired count value of the N-ary counter through use of a decoder, is output as the address generating clock ACK, the readout control signal RC and the write clock WCK. The period $T_2$ of the system clock SCK is so selected as to satisfy Eq. (1).

Figure 6:
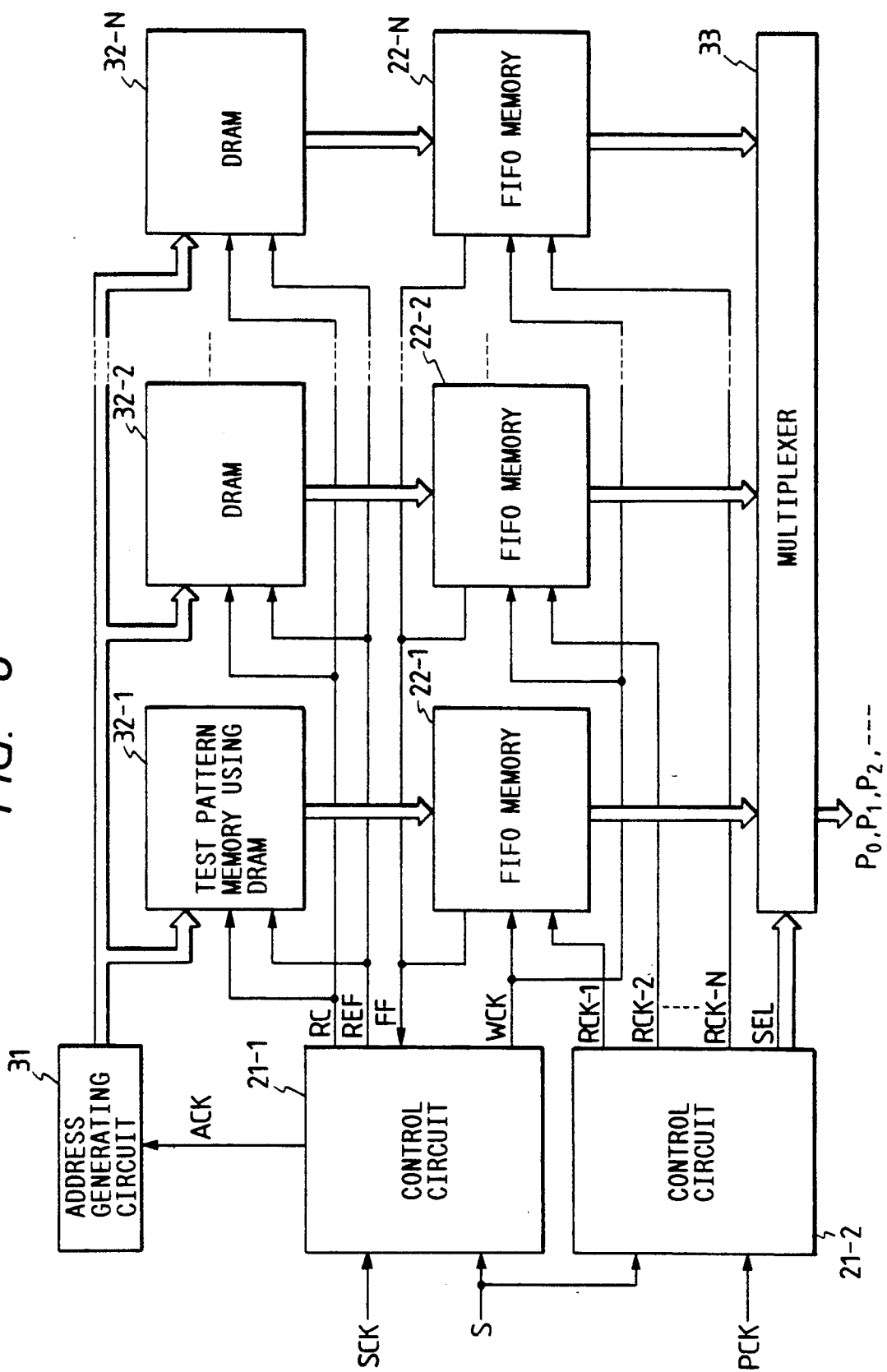
FIG. 6 is a block diagram illustrating another modified form of the present invention.
Figure 7:
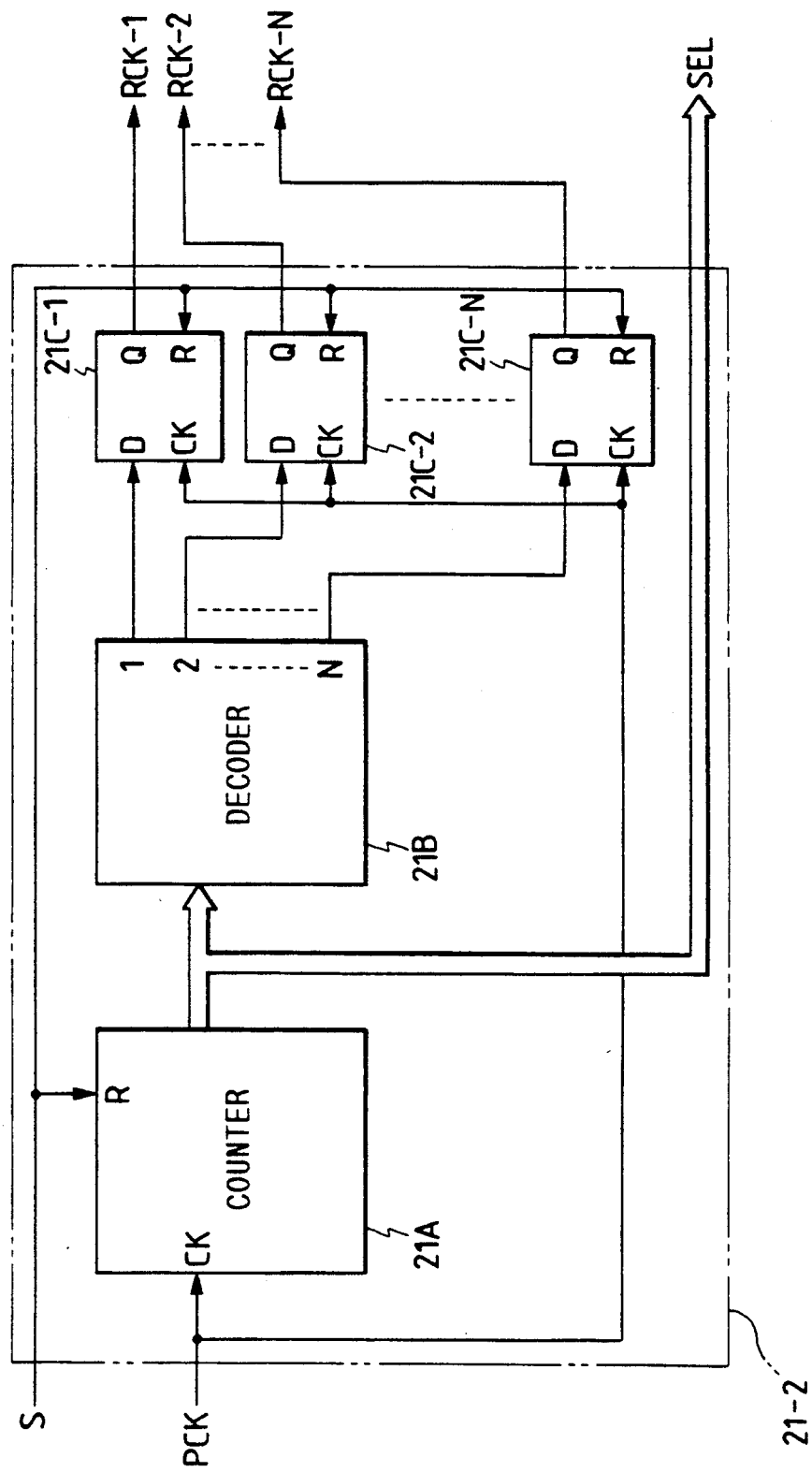
FIG. 7 is a circuit diagram showing a specific operative example of a control circuit 21-2 used in the embodiment of FIG. 6

It is also possible to obtain test patterns at high speed by using such an arrangement as shown in FIG. 6, in which N test pattern memories 32-1 to 32-N and N FiFo memories 22-1 to 22-N are provided in combination and are concurrently operated by the addresses, the readout control signal RC, the refresh control signal REF and the write clock WCK common to them and test patterns thus read out of the N FiFo memories by readout clocks RCK-1 to RCK-N are taken out by the multiplexer 33 sequentially and cyclically. In this instance, a control circuit 21-1 may be the same as that shown in FIG. 3. A control circuit 21-2 is composed of an N-ary counter 21A, a decoder 21B and N flip-flops 21C-1 to 21C-N, as depicted in FIG. 7. The N-ary counter 21A and the flip-flops 21C-1 to 21C-N are reset by the start signal S. The N-ary counter 21A repeatedly counts the pattern generating clock PCK from 0 to N−1. The decoder has N output terminals and provides high-level outputs to its output terminals 1 to N one after another as the count value of the counter 21A varies from 0 to N−1 in a sequential order. The outputs of the decoder 21B are respectively taken into the flip-flops 21C-1 to 21C-N in synchronism with the pattern generating clock PCK and their Q outputs sequentially go high for one cycle period of the clock PCK. Such Q outputs of the flip-flops are used as readout clocks RCK-1 to RCK-N of the FiFo memories 22-1 to 22-N. On the other hand, the count value of the counter 21A is provided as the select signal SEL to the multiplexer 33.

INDUSTRIAL APPLICABILITY

As described above, according to the present invention, test patterns can continuously be obtained from the FiFo memory even during the refresh of the DRAM, since the test pattern generator has an arrangement in which test patterns read out of the test pattern memory formed by the DRAM are written into the FiFo memory which is read out by the pattern generating clock. Since the test pattern memory is formed by the DRAM, even an extended pattern can be produced by a low-cost device.

I claim:

1. A test pattern generator to generate a test pattern on the basis of stored data in response to a system clock, a start signal and a pattern generating clock, comprising:
    a control circuit operatively connected to operate in response to the system clock to generate an address generating clock, a readout control signal and a write clock in response to the start signal and a full flag signal and to generate a refresh control signal periodically;
    an address generating circuit operatively connected to receive the address generating clock from said control circuit to generate an address in response to the address generating clock;
    test pattern memory having at least one DRAM capable of storage therein of a test pattern, said test pattern memory operatively connected to said control circuit to read out the test pattern in response to the readout control signal from said control circuit and the address from said address generating circuit and to perform a refresh operation in response to the refresh control signal; and
    a FiFo memory operatively connected to write therein the test pattern from said test pattern memory in response to the test pattern in synchronism with the pattern generating clock and to output the full flag signal when filled with test patterns.

2. The test pattern generator according to claim 1, wherein, letting the period of the pattern generating clock, the readout period of the test pattern memory and the time for the refresh of the test pattern memory be represented by $T_1$, $T_2$ and $T_r$, respectively, and assuming that the test pattern memory performs the refresh operation every m-th readout therefrom, the period $T_1$ and $T_2$ are selected so that the following equation holds:

$$m \times T_1 > m \times T_2 + T_r.$$

3. The test pattern generator according to claim 2, wherein said control circuit includes:
    timing generating means for generating, in synchronism with the system clock, the address generating clock, the readout control signal and the write clock with the same period $T_2$ and the refresh control signal with a period $m \times T_2 + T_r$;
    gate means for gating the address generating clock, the readout control signal and the write clock in response to an enable signal;
    enable signal generating means for generating the enable signal in response to the start signal;
    full flag signal detecting means for detecting a leading edge of the full flag signal and for causing said enable signal generating means to stop the generation of the enable signal;
    full flag edge detecting means for detecting a trailing edge of the full flag signal and for causing said enable signal generating means to generate the enable signal; and
    enable inhibit means for inhibiting supply of the enable signal to said gate means in response to the refresh control signal.

4. The test pattern generator according to claim 1, wherein said test pattern memory includes:
    a plurality of N DRAMs operatively connected to receive in parallel the address from said address generating circuit and to receive in parallel the readout control signal and the refresh control signal from said control circuit, N being an integer equal to or greater than two; and
    a DRAM multiplexer operatively connected to sequentially provide test patterns from said plurality of N DRAMs to said FiFo memory.

5. The test pattern generator according to claim 1, wherein said test pattern memory includes a plurality of N DRAMs operatively connected to receive in parallel the address from said address generating circuit and to receive in parallel the readout control signal and the refresh control signal from said control circuit, N being an integer equal to or greater than two; and
    wherein said FiFo memory includes:
    a plurality of N FiFo memories operatively connected to write therein the test patterns received from said plurality of N DRAMs in response to a parallel connection of the write clock from said control circuit, and
    a FiFo multiplexer operatively connected to sequentially provide the test patterns from said plurality of N FiFo memories.

6. The test pattern generator according to claim 5, wherein said control circuit includes clock generating means for generating N readout clocks and for sequentially and cyclically reading out of said N FiFo memories in synchronism with the pattern generating clock, and select signal generating means for generating a select signal and for sequentially and cyclically switching said FiFo multiplexer in synchronism with the pattern generating clock.

* * * * *